(12) United States Patent
Ypma et al.

(10) Patent No.: US 11,099,485 B2
(45) Date of Patent: Aug. 24, 2021

(54) MAINTAINING A SET OF PROCESS FINGERPRINTS

(71) Applicant: ASML NETHERLANDS B.V., Veldhoven (NL)

(72) Inventors: Alexander Ypma, Veldhoven (NL); Vahid Bastani, Eindhoven (NL); Dag Sonntag, Eindhoven (NL); Jelle Nije, Leerdam (NL); Hakki Ergün Cekli, Singapore (SG); Georgios Tsirogiannis, Eindhoven (NL); Robert Jan Van Wijk, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 126 days.

(21) Appl. No.: 16/493,326

(22) PCT Filed: Apr. 9, 2018

(86) PCT No.: PCT/EP2018/058997
§ 371 (c)(1),
(2) Date: Sep. 12, 2019

(87) PCT Pub. No.: WO2018/192789
PCT Pub. Date: Oct. 25, 2018

(65) Prior Publication Data
US 2021/0157247 A1 May 27, 2021

(30) Foreign Application Priority Data
Apr. 19, 2017 (EP) .................................... 17167117

(51) Int. Cl.
*G03F 7/20* (2006.01)
*G03F 9/00* (2006.01)

(52) U.S. Cl.
CPC .......... *G03F 7/70491* (2013.01); *G03F 7/705* (2013.01); *G03F 7/70616* (2013.01); *G03F 7/70633* (2013.01); *G03F 9/7003* (2013.01)

(58) Field of Classification Search
CPC .. G03F 7/70491; G03F 7/705; G03F 7/70525; G03F 7/70616; G03F 7/70633;
(Continued)

(56) References Cited

U.S. PATENT DOCUMENTS

| 2008/0183412 A1 | 7/2008 | Funk et al. |
| 2014/0065733 A1 | 3/2014 | Ausschnitt |

(Continued)

FOREIGN PATENT DOCUMENTS

| CN | 105765461 | 7/2016 |
| KR | 1020160067146 | 6/2016 |

(Continued)

OTHER PUBLICATIONS

International Search Report and Written Opinion issued in corresponding PCT Patent Application No. PCT/EP2018/058997, dated Jul. 25, 2018.

(Continued)

*Primary Examiner* — Colin W Kreutzer
(74) *Attorney, Agent, or Firm* — Pillsbury Winthrop Shaw Pittman LLP

(57) ABSTRACT

A method of maintaining a set of fingerprints representing variation of one or more process parameters across wafers subjected to a device manufacturing method, the method including: receiving measurement data of one or more parameters measured on wafers; updating the set of fingerprints based on an expected evolution of the one or more process parameters; and evaluation of the updated set of fingerprints based on decomposition of the received measurement data in terms of the updated set of fingerprints.

(Continued)

Each fingerprint may have a stored likelihood of occurrence, and the decomposition may involve: estimating, based the received measurement data, likelihoods of occurrence of the set of fingerprints in the received measurement data; and updating the stored likelihoods of occurrence based on the estimated likelihoods.

20 Claims, 6 Drawing Sheets

(58) Field of Classification Search
CPC .. G03F 7/70875; G03F 9/7003; G03F 9/7007; G03F 9/7019
USPC .......................................... 355/52, 53, 68, 77
See application file for complete search history.

(56) References Cited

U.S. PATENT DOCUMENTS

| | | |
|---|---|---|
| 2016/0246185 A1 | 8/2016 | Ypma et al. |
| 2017/0160648 A1 | 6/2017 | Tel et al. |
| 2019/0137892 A1* | 5/2019 | Cekli ................... G03F 7/70633 |
| 2019/0163075 A1* | 5/2019 | Theeuwes ........... G03F 7/70508 |
| 2020/0233315 A1* | 7/2020 | Nije .................... G03F 7/70491 |

FOREIGN PATENT DOCUMENTS

| | | |
|---|---|---|
| TW | 201617740 | 5/2016 |
| WO | 2014032833 | 3/2014 |
| WO | 2015049087 | 4/2015 |
| WO | 2017060080 | 4/2017 |

OTHER PUBLICATIONS

Taiwanese Office Action issued in corresponding Taiwanese Patent Application No. 107113111, dated Nov. 21, 2018.
Lam, Auguste, et al.: "Pattern recognition and data mining techniques to identify factors in wafer processing and control determining overlay error", Proc. of SPIE, vol. 9424, Mar. 19, 2015.
Chinese Office Action issued in corresponding Chinese Patent Application No. 201380025802.4, dated Feb. 26, 2021.
Korean Office Action issued in corresponding Korean Patent Application No. 10-2019-7033994, dated May 17, 2021.

* cited by examiner

MAINTAINING A SET OF PROCESS FINGERPRINTS

CROSS-REFERENCE TO RELATED APPLICATIONS

This application is the U.S. national phase entry of PCT Patent Application No. PCT/EP2018/058997, filed on Apr. 9, 2018, which claims the benefit of European patent application Ser. No. 17/167,117.5, which was filed on Apr. 19, 2017 and which is incorporated herein in its entirety by reference.

BACKGROUND

Field of the Invention

The present invention relates to a method of maintaining a set of fingerprints representing variation of one or more process parameters associated with one or more product units, usable, for example, in the manufacture of devices by lithographic techniques. The present invention also relates to associated computer programs and computer program products, and apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields". Wafers are processed in batches or lots through various apparatuses in the semiconductor fabrication facility (fab). The integrated circuit is built up layer by layer with a lithographic step performed by a lithographic apparatus at each layer and other fab processes being performed in between lithographic steps.

Before the imaging step, various chemical and/or physical processing steps are used to form and prepare the layer for patterning. After the imaging step defines the pattern, further chemical and/or physical processing steps work through the pattern to create functional features of the integrated circuit. The imaging and processing steps are repeated in a multi-layer process to build integrated circuit.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

Modern multi-layer lithographic processes and products are so complex that issues due to processing are difficult to trace back to the root cause. Monitoring of wafer integrity and design of an appropriate correction strategy is therefore a time-consuming and laborious exercise.

International Patent Application WO 2015049087, which is incorporated by reference herein in its entirety, discloses a method of obtaining diagnostic information relating to an industrial process. Alignment data or other measurements are made at stages during the performance of the lithographic process to obtain object data representing positional deviation or other parameters measured at points spatially distributed across each wafer. Overlay and alignment residuals typically show patterns across the wafer, known as fingerprints. This object data is used to obtain diagnostic information by performing a multivariate analysis to decompose the set of vectors representing the wafers in multidimensional space into one or more component vectors. Diagnostic information about the industrial process is extracted using the component vectors. The performance of the industrial process for subsequent wafers can be controlled based on the extracted diagnostic information.

In the fab, semiconductor process steps may thus leave their fingerprints on the product wafers. The lithographic apparatus has many in-line sensors, in addition to alignment sensors, that can measure these fingerprints. These include leveling sensors, sensors for aligning the reticle to the wafer stage chuck (e.g. "transmission image sensors" or "parallel integrated lens interferometer" type sensors) and sensors related to actuator stability. The lithographic apparatus' sensors are examples of sensors that can measure values of parameters spatially distributed across substrates. As well as a fingerprint representing the spatial distribution across the substrate, a fingerprint may represent a distribution of a process parameter across different wafers of a wafer lot. The term "process parameter" in this document needs to be read as any parameter associated with the semiconductor manufacturing process that may be relevant for a fingerprint of a (process) parameter fingerprint on a product unit (e.g. a substrate, wafer). A process parameter may hence be a parameter associated with a measurement performed by a sensor (for example within the lithographic apparatus or an etching apparatus) or (context) information related to a configuration of one or more of the apparatus used within the semiconductor manufacturing process (e.g. a certain etch chamber used for etching). For example a fingerprint obtained from "parallel integrated lens interferometer" sensors could represent a reticle heating signature across the wafer lot. Embodiments of the present invention utilize these sensors to characterize many or all individual processes (e.g. etch, deposition, develop track). This is possible as the scanner is involved at least once during fabrication of a layer on a wafer. The scanner can apply its sensors to all wafers passing through the lithographic process at least once per layer.

Via the many sensors, wafer, zone, field and die fingerprints may be derived from the wafers that are being exposed. It is useful to identify the fingerprints that are present on a certain set of layers on a wafer, and relate the presence of these fingerprints to processing and scanner context (to find the 'root cause') and expected on-product performance effects such as overlay, CD (critical dimension), focus, voltage contrast, CD-SEM, electrical tests (to determine 'yield impact').

Fingerprints referred to herein are the main systematic contributors (or "latent factors") of the measured signal. They are typically connected to the performance impact on-wafer or to previous processing steps. They can refer to wafer grid patterns (e.g. from alignment, leveling, overlay, focus, CD), field patterns (e.g. from intrafield alignment, leveling, overlay, focus, CD), wafer zone patterns (e.g. outermost radius of wafer measurements) or even patterns in scanner measurements related to wafer exposure (e.g. heating signature through-lot from reticle align "transmission image sensors" or "parallel integrated lens interferometer" type sensors measurements, temperature/pressure/servo profiles, etc.).

Measurement data referred to herein may be any measurements performed on the wafer and intended to be used for monitoring and control, e.g. leveling, alignment, overlay, CD, focus, SWA (side-wall angle), etc.

Performance data referred to herein may be any measurements performed on the wafer that are representative of an expected quality of processed wafers (product units). Performance data comprises typically values of one or more performance parameters, such as: overlay error, CD (critical dimension), focus error, Edge Placement Error (EPE), voltage contrast signals, CD-SEM signals, electrical test signals (to determine 'yield impact'), any other signal representative for the yield of the process. Typically performance data comprises one or more fingerprints of aforementioned performance parameter(s) across a product unit.

A fingerprint library referred to herein is a collection or set of fingerprints that may be encoded homogenously or heterogeneously.

Conventional control strategies try to minimize the average observed error (e.g. overlay, focus, CD) in a lot or group of wafers. There are two limitations with this approach: the control/monitoring is done with hard assignment by assuming clustering among wafers; the fact that the monitored feature (overlay, CD, etc.) is the contribution of the different factors is ignored in these methods. This is particularly restrictive when the scope of the monitoring/control is extended, space-wise, from scanner to the whole-fab and, time-wise, from per-layer to through-stack.

In particular, one would like to understand the main fingerprints that contribute to potential overlay/CD/focus issues and eventually yield issues—when retrieving data from exposures of a new product/node/process in the ramp up phase in a semiconductor fab. Fine tuning and troubleshooting using convention methods may take months of time from an experienced semiconductor engineer, which is compromising time-to-yield—and hence time-to-market of a new product/node/process.

SUMMARY

The inventors have devised a way to maintain a set of fingerprints while avoiding or at least mitigating one or more of the associated problems mentioned above.

The invention in a first aspect provides a method of maintaining a set of fingerprints representing variation of one or more process parameters associated with one or more product units, the method comprising the steps:

(a) receiving measurement data of one or more parameters measured on one or more product units;

(b) determining a first updated set of fingerprints based on an expected evolution of the set of fingerprints; and (c) determining a second updated set of fingerprints based on decomposition of the received measurement data in terms of the first updated set of fingerprints.

The invention in a second aspect provides a computer program comprising computer readable instructions which, when run on suitable computer apparatus, cause the computer apparatus to perform the method of the first aspect.

The invention in a third aspect provides a computer program product comprising the computer program of the second aspect.

The invention in a fourth aspect provides an apparatus specifically adapted to carry out the steps of the method of the first aspect.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
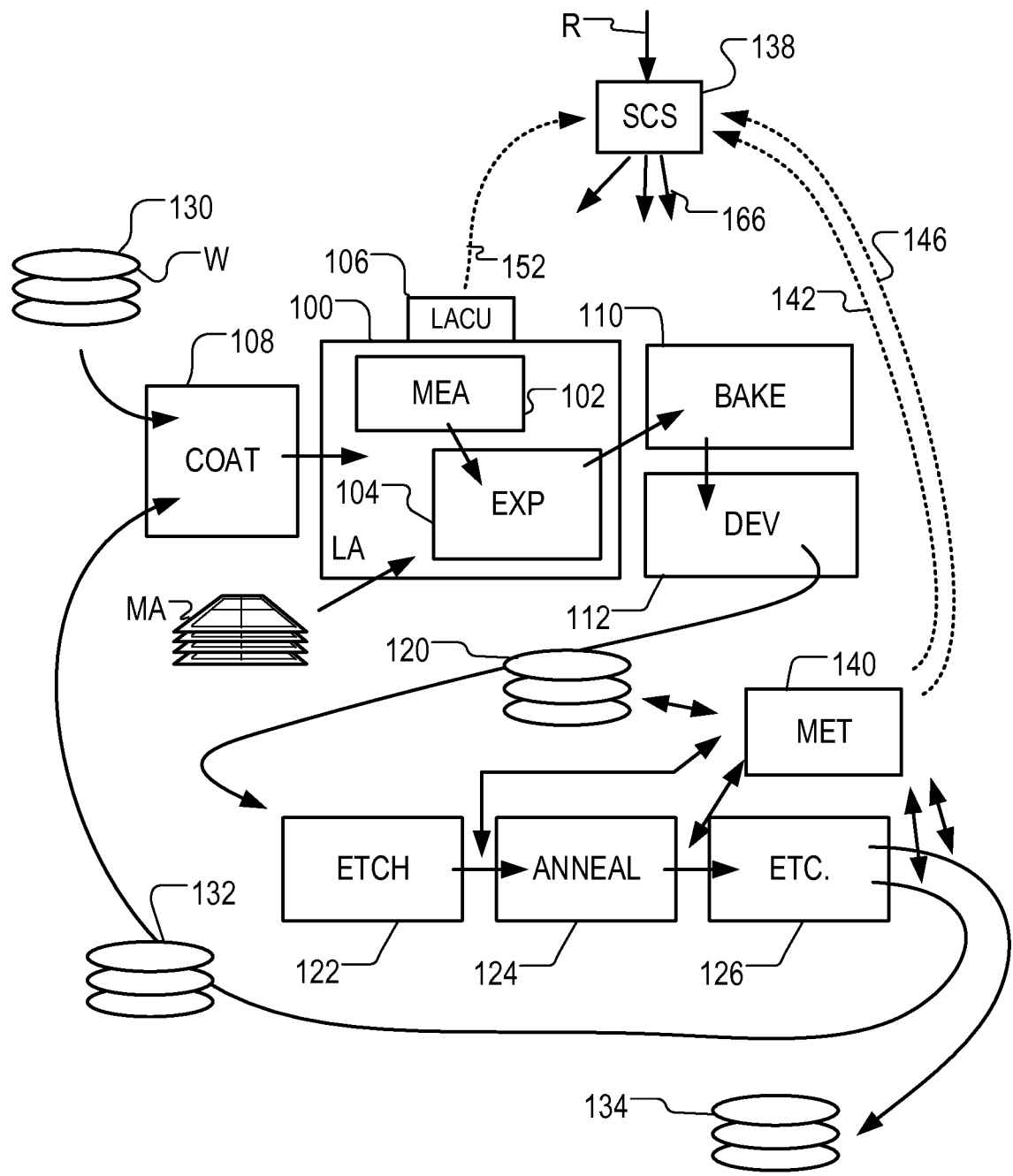
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and computing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments 166 over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

An embodiment of the present invention gives the ability to characterize the full stack of layers through the lifecycle of an integrated circuit, by using a lithographic apparatus with its built in sensors to capture fingerprints through the stack of layers. This characterization is correlated to the process steps in between exposures defining each layer. The analysis of fingerprints through the stack of layers provides the capability to correct for the phenomena in the multi-layer process which are complex and time varying. For example, new equipment and new process recipes are constantly generating new fingerprints.

The lithographic apparatus has many in-line sensors in addition to alignment sensors. These include leveling sensors, sensors for aligning the reticle to the wafer stage chuck (e.g. "transmission image sensors" or "parallel integrated lens interferometer" type sensors) and sensors related to actuator stability. The lithographic apparatus' sensors are examples of sensors that can measure values of parameters spatially distributed across substrates. As well as a fingerprint representing the spatial distribution across the substrate, a fingerprint may represent a distribution of a process parameter across different wafers of a wafer lot. For example a fingerprint obtained from "parallel integrated lens interferometer" sensors could represent a reticle heating signature across the wafer lot. Embodiments of the present invention utilize these sensors to characterize many or all individual processes (for example etch, deposition, develop track). This is possible as the scanner is involved at least once during fabrication of a layer on a wafer. The scanner can apply its sensors to all wafers passing through the lithographic process at least once per layer.

The scanner sensors used to determine a fingerprint may be dynamic. For example, for one layer the alignment sensor may be found to be most useful to determine a fingerprint representative for a process step, while for another layer a levelling sensor may be more informative. The use of sensors and the combination of sensor signals that yields most representative results (e.g. most informative for process control and processing apparatus optimization) may be subject to change and machine learning approaches may be used to converge to a per-layer optimal sensor signal constellation (e.g. layer 1: alignment color 1, layer 2: alignment color 2+leveling, . . . etc.)

As mentioned above, the wafers are processed through the stack of layers, the lithographic apparatus can capture the fingerprints at all the different steps. Fingerprint patterns can be related to each other by performing a through-stack analysis and fingerprints common across layers can be related back to events and phenomena occurring at each layer. This makes possible to properly optimize the processing apparatuses for subsequent process steps. These subsequent process steps performed by the optimized apparatus may be applied to the wafers from which the fingerprints were obtained. In that case, the corrections are applied during the processing of a wafer through its stack of layers, as a kind of real-time correction. This is an example of optimizing an apparatus for processing product units from which the object data was measured, at subsequent stages in the multi-stage processing. The subsequent process steps performed by the optimized apparatus may apply to steps throughout the processing of other wafers, including wafers processed in future. The optimized apparatus may be used to perform process steps at earlier as well as later stages in the process flow than the stage at which the analysis and optimization is performed. The optimization can involve fixing an identified process apparatus and/or process recipe. It can also involve using dedicated scanner corrections via alignment or overlay corrections.

Embodiments of the present invention provide dynamically refined (adaptive) computation of current relevant fingerprints in incoming measurement data, without hard assignment of fingerprints to process control threads. The fingerprints may be determined for various key performance indicators (e.g. available scanner data) and yield. Uncertainties are made explicit, and all data may be used for improved estimations of all fingerprints (not necessarily with a "hard" split per thread), while the factorial model leaves inference mechanism tractable.

Embodiments of the present invention provide optimal initialization and in-line decomposition by combining fingerprints from domain knowledge and by decomposition of new incoming measurement data into the active fingerprint library.

After decomposition of the received measurement data, the underlying main fingerprints can be identified. Based on the decomposition actions can be identified for improvement.

Embodiments of the present invention provide on-the-fly linking to context and yield impact assessment. Fingerprints may be linked to incoming context history in the fab, and used for real-time yield (electrical probing, voltage contrast, CD-SEM) impact assessment. Yield assessment may be performed during the IC manufacturing process, which is much earlier than when actual yield data available.

Embodiments of the present invention provide a way to find and track the contributing factors, called active fingerprints (AFPs), to the wafer measurements in real-time. Wafer measurements include, but are not limited to, alignment, leveling, overlay and CD. In order to achieve this, embodiments incorporate the prior knowledge (i.e. domain expertise and mining of existing data) about common fingerprints, called reference fingerprints (RFPs), as well as real-time data analysis in order to find the main contributing factors in the wafer measurements. In other words, it finds the contributing factors by decomposing the wafer measurements to the current instantiation (AFPs) of the known fingerprints (RFPs). Furthermore, embodiments have a mechanism to track systematic changes and drifts (evolution) in the AFPs and find new fingerprints when the current set of AFPs is not enough for explaining the measurements. In addition, a validator may be integrated in the model that examines the newly found AFPs against statistical evidence coming from measurement to validate if the found AFP is systematic and not due to noise. Embodiments enable dynamic wafer control by exploiting the model for metrology estimation.

Hence we are able to monitor the contribution of different factors in the measurements as well as keeping track of the fingerprints they put on the wafer. This results in a more natural fab process model that enables adaptive and dynamic control mechanism for per-wafer optimal control estimation and on-product performance impact analysis. In addition, this method can facilitate the root-cause and performance impact analysis as the factors can be traced through-stack and linked to process steps.

Figure 2:
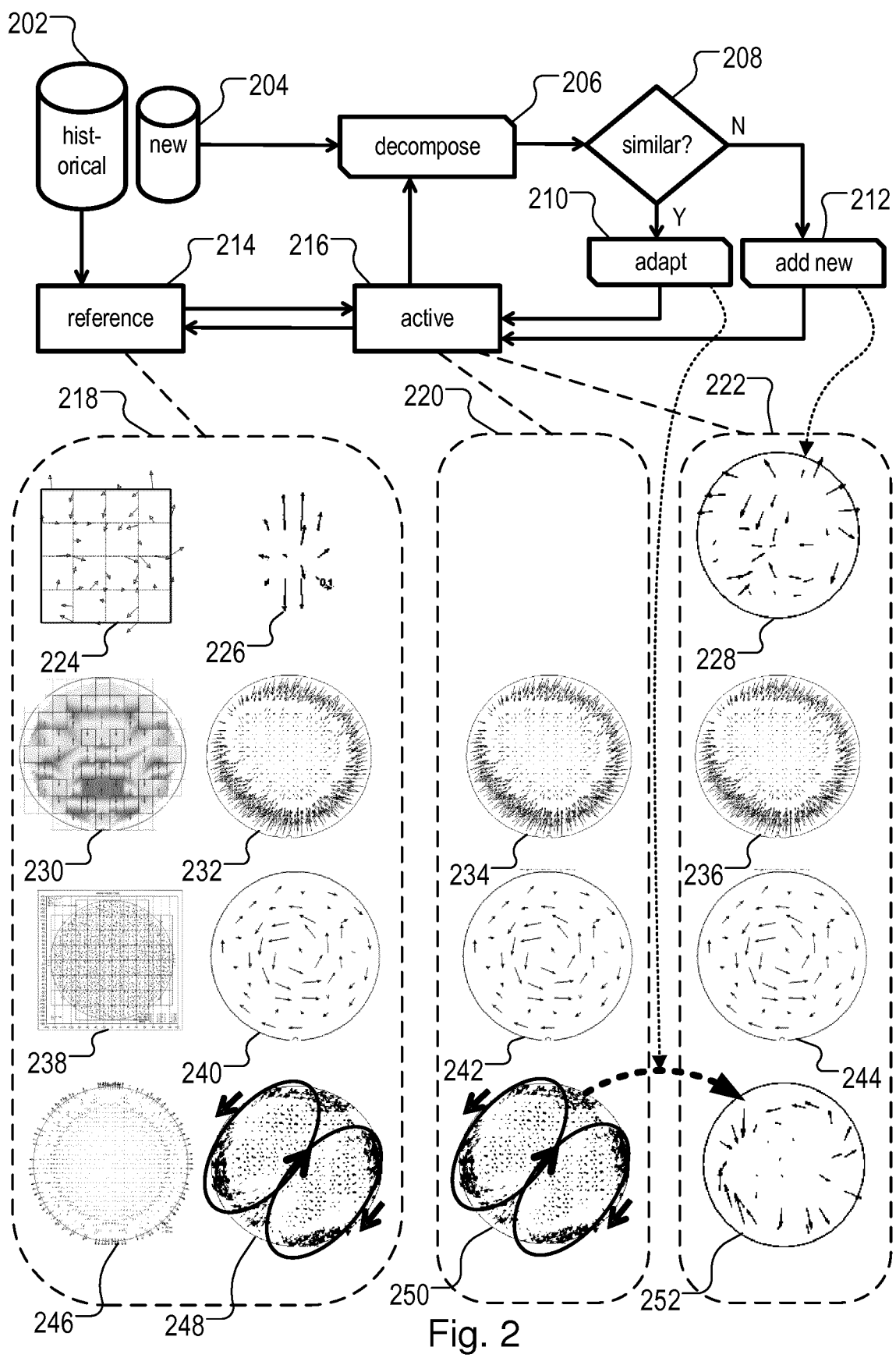
FIG. 2 is a flowchart of a method according to an embodiment of the present invention illustrating the reference fingerprint library and active fingerprint library.

FIG. 2 is a flowchart of a method according to an embodiment of the present invention illustrating the reference fingerprint library and active fingerprint library.

With reference to FIG. 2, the active fingerprint library 216 is a set of fingerprints representing variation of one or more process parameters across one or more product units, such as wafers. New measurement data 204 of one or more parameters measured on one or more product unit is received. The active fingerprint library 216 is first updated based on an expected evolution of the set of fingerprints, which may be based on an expected evolution of one or more process parameters. Evolution herein means a development associated with one or more of: a random variation (noise), drift due to heating, drift due to dynamics, oscillation due to dynamics, drift due to wear of components, (near) stable behavior. Further updating of the updated set of fingerprints is based on decomposition 206 of the received measurement data 204 in terms of the first updated set of fingerprints. If the decomposed fingerprints are similar 208 to the first updated fingerprints, then the active fingerprint library 216 may be updated by adapting 210 a fingerprint. If the fingerprints are not similar 208, then the active fingerprint library 216 may be updated by adding 212 a new fingerprint to the active library. Fingerprints may also be removed from the active library.

Fingerprints may be added to the active library 216 by retrieving a fingerprint from a set of reference fingerprints in a reference fingerprint library 214. This can involve warping the retrieved fingerprint to determine the added fingerprint. The set of reference fingerprints in the reference fingerprint library 214 are derived from historical measurement data 202 representing one or more parameters measured on wafers.

The reference fingerprint library 214 may be updated itself with an updated fingerprint from the active library 216.

Examples 218 of fingerprints in the reference fingerprint library 214 are shown. The fingerprints are examples of writing errors 224, reticle heating 226, SUSD 230 (scan up/scan down effect, which is a measure of the shift of the fields exposed in the "up" scan direction with respect to the fields exposed in the "down" scan direction), etch 232, scanner chuck 238, CMP (chemical mechanical polish) 240, "ripple" 246 and anneal "dual swirl" 248.

The initial fingerprints 220 of the active library 216 are shown. Fingerprints 234, 242 and 250 are copies of the reference fingerprints 232, 240 and 248 respectively. Fingerprints 222 at a later time in the active library 216 are also shown. Fingerprint 228 is an example of a new fingerprint added at step 212. Fingerprint 252 is an example of an adapted fingerprint from step 210. Fingerprints 236 and 244 are both still present, although their stored likelihoods of occurrence (not shown) may be different from one instance 220 to the other 222.

Figure 3:
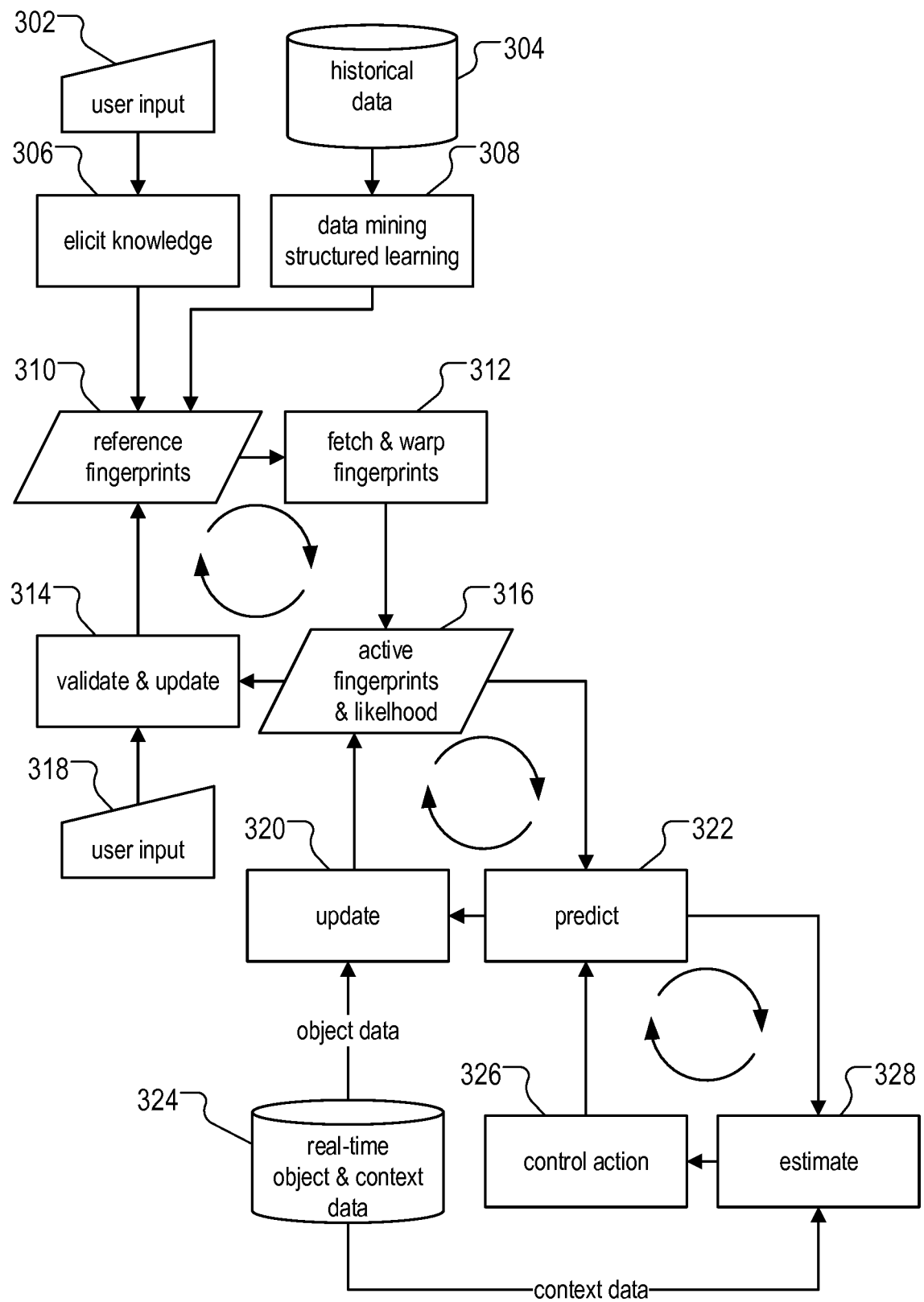
FIG. 3 is a flowchart of a method according to an embodiment of the present invention.

FIG. 3 is a flowchart of a method according to an embodiment of the present invention.

It illustrates a method of maintaining a set of fingerprints in an active fingerprint library 316. The fingerprints represent variation of one or more process parameters across product units. In this example, the product units are wafer substrates. The method includes the steps: (a) receiving measurement data 324 of one or more parameters measured on wafers; (b) determining 320 a first updated set of fingerprints in the active fingerprint library 316 based on an expected evolution 322 of the set of fingerprints; and (c) determining 320 a second updated set of fingerprints based on decomposition of the received measurement data in terms of the first updated set of fingerprints. Each fingerprint may have a stored likelihood of occurrence, and the decomposition may involve: estimating, based the received measurement data, likelihoods of occurrence of the set of fingerprints in the received measurement data; and updating the stored likelihoods of occurrence based on the estimated likelihoods.

The decomposition may comprises using a factorial model wherein the estimated likelihoods of occurrence comprise coefficients of the factorial model.

Based on the decomposition of the received measurement data inferences may be made to characteristics of performance data and/or process control action(s) configured to correct for a certain deviation of the inferred performance data with respect to a nominal value of the performance data. The performance data typically comprises one or more fingerprints of a performance parameter across a product unit (for example overlay error, focus error, CD, etc.).

Context data 324 represents records of one or more process parameters of the wafer(s) on which the measurement data was measured. The updating 320 of the active fingerprint library 316 may then be based on the context data 324. Context data may comprise for example data related to a particular usage of processing apparatus to process a substrate (particular etch chamber, particular CMP apparatus, type of lithographic apparatus, etc.) or parameter data representing measured values associated with one or more processes (such as temperature, signal strength, signal confidence, etc.).

The step 320 of updating the active fingerprint library may comprise calculating 328 expected measurement data. The calculation is based on predicted 322 fingerprints, which themselves may be based on the expected evolution of the set of fingerprints. The expected evolution of the set of fingerprints may be based on a model predicting the evolution of the set of fingerprints based on knowledge associated with an observed evolution of one or more process parameters. The calculation is also based on the received context data. A process control action 326 is then determined based on the calculated expected measurement data. The fingerprints in the active fingerprint library 316 may then be updated based on the determined process control action 326.

Updating 320 the set of fingerprints in the active library 316 may comprise adapting a fingerprint, adding a new fingerprint to the set and removing a fingerprint from the set.

Fingerprints may be added to the active fingerprint library 316 by retrieving (fetching) 312 a fingerprint from a set of reference fingerprints in a reference fingerprint library 310. This may involve warping 312 the retrieved fingerprint to determine the added fingerprint.

The set of reference fingerprints in the reference fingerprint library 310 are derived 308 from historical measurement data 304 representing one or more parameters measured on wafers.

The reference fingerprint library 310 can be updated 314 with an updated fingerprint from the active fingerprint library 316. User input 318 may be used to validate 314 the update.

These steps are described in more detail below.

Initial Setup 302-308: During initial setup reference fingerprints may be identified using three procedures:

Knowledge elicitation 306: Domain experts are consulted 302 for identification of fingerprints tool/process fingerprints they recognize. The fingerprints' shapes and variations are then encoded in the parametric or non-parametric form and put in the reference fingerprint library 310.

Data mining 308: Historical measurement data 304 is analyzed 308 by means of different exploratory data analysis techniques, e.g. cluster analysis, component analysis, to identify fingerprints. The fingerprints shapes and variations are then encoded in the parametric or non-parametric form and put in the reference fingerprint library.

Dynamic identification 314: Factors recognized by the adaptation procedure during wafer measurement decomposition are described below.

Reference Library 310-312: Consists of a repository of generic and heterogeneous fingerprints and some functionality to instantiate the fingerprints on a desired layout.

Reference Fingerprints 310: Container where generic fingerprints objects, called reference fingerprints, known from historical observations or physical definition, are stored. The fingerprints may be encoded in different parametric and non-parametric ways. The information of each fingerprint may contain its average shape, the shape variation and meta-data information about its history, root-causes, etc.

Fetch & Warp 312: The process of instantiating a generic reference fingerprint on the desired layout. This may generate a form of probability distribution that represents the shape of the fingerprint and its variation. This may be done by statistical function regression techniques (such as Gaussian Process, linear regression etc.) and/or by sampling techniques (Monte-Carlo sampling) and/or by parametric function evaluation. Warping means: not only layout-adaptations but also shape adaptations can be applied to instantiate the generic reference fingerprint. E.g. affine transformations of a basic shape (translating, rotating, scaling the shape) may be considered 'admissible variants' of the same shape. Warping may be implemented explicitly (e.g. by executing the transformation when instantiating), or implicitly (e.g. by using a rotation-invariant similarity metric or kernel when projecting new data to the fingerprint basis).

Active Library 314-322: Includes storage and functionality required to maintain and track changes of the state of fingerprints contribution the wafer measurements:

Active Fingerprints 316: Container where the current state of fingerprints are stored as some form of probability distribution that represents the shape of the fingerprint and its variation.

Furthermore, information regarding the dynamics and statistics of each fingerprint may be stored alongside, such as a likelihood of occurrence. Initially the active fingerprints are fetched from the reference fingerprint library.

Predict 322: Predicts the state of the active fingerprints based on the fingerprints dynamic (evolution) models, process timing information and control actions for the upcoming wafer measurement. A combination probabilistic inference techniques may be used here (Variant of Bayesian recursive filtering, e.g. Kalman filtering, Particle filtering)

Update 320: Uses the predicted fingerprints and wafer measurement to:

A) Decompose the incoming wafer measurement in terms of the active fingerprints. Different component analysis methods can be employed based on the required regularization and constraints (e.g. sparse coding, dictionary learning, lasso/ridge regression, etc.). In addition, context sensitive wafer clustering may be used in decomposition to exploit clustering structure in the decomposition coefficients.

The basis on which the data is being decomposed can be either orthogonal or overcomplete. Hence, we enable heterogeneity in the reference library and still have an active library on which incoming data can be decomposed. Usually the measurements or the model parameter of several wafers, lots, fields, etc. can be organized on a tabular form. The columns represent different features (e.g. marks, parameters), while rows represent different instances (e.g. fields, wafers, lots). This rectangular/square representation can be seen as a algebraic matrix (real or complex) and accepts several kinds of decompositions. Those decompositions can be thought as different ways the basic elements of the matrices are presented. For example principal component decomposition, shows the fingerprints within the data having maximum variance which is an excellent way to obtain fingerprints from statistical point of view where variance is a key factor. Suitable decompositions may be based on representation learning, among which manifold learning methods are frequently utilized. Manifold learning methods may further be divided into linear or non-linear methods of dimensionality reduction. Some implementations may utilize additional physical information (for example by inclusion of pre-knowledge of characteristics of components). For the purposes of this invention it is suggested to utilize the power of matrix decompositions and/or representation learning methods. The list below is incomplete but gives an idea of potentially suitable algorithms of decomposition:
i) General:
Sparse dictionary
Rank Factorization (A=CF)
Interpolative decomposition
Jordan
Schur
QZ
Takagi
Polar
Clustering
ii) Orthogonal:
QR decomposition
LQ
SVD (singular value decomposition)
iii) Spectral:
Eigenvalue decomposition
iv) Non-negative:
Factorization to matrices that have non-negative values
v) Non-linear methods:
Neural network based representation learning e.g. Variational Auto Encoder (VAE).
B) Calculate the corrections for updating the active fingerprints. Depending on the representation of active fingerprint different methods can be employed here such as updating of sufficient statistics, MAP (maximum a posteriori probability) estimate, ML (maximum likelihood) estimate.
C) Identify new fingerprints when the set of active fingerprints are not enough to explain wafer measurement. A combination of change/novelty/abnormality detection methods and/or nonparametric latent component models (e.g. Dirichlet Process and Indian Buffet Process) may be used here.

Validate 314: Statistically evaluates the dynamically identified fingerprints to check if they are systematic or due to noise. When a fingerprint is confirmed, a user can decide 318 to put it to the reference library. Sequential log-likelihood ratio test is a possible implementation for this block.

Estimate 328: Calculates the expected measurement (in terms of the wafer measurement) using the predicted active fingerprints as well as contextual information 324 by means of predictive models. A combination of statistical inference and/or predictive models may be used for this purpose.

Control action 326: Finds optimal process control action based on the calculated expected measurement.

The method's process flow contains three intertwined loops: identification, updating and control. The identification loop (shown within 310, 312, 316, 314) is asynchronous governed by the rate of insertion of dynamically identified fingerprints in the reference library. On the other hand, the updating (within 316, 322, 320) and control loop (within 322, 328, 326) cycles are synchronized to the rate of receiving wafer measurements (per wafer).

Figure 4:
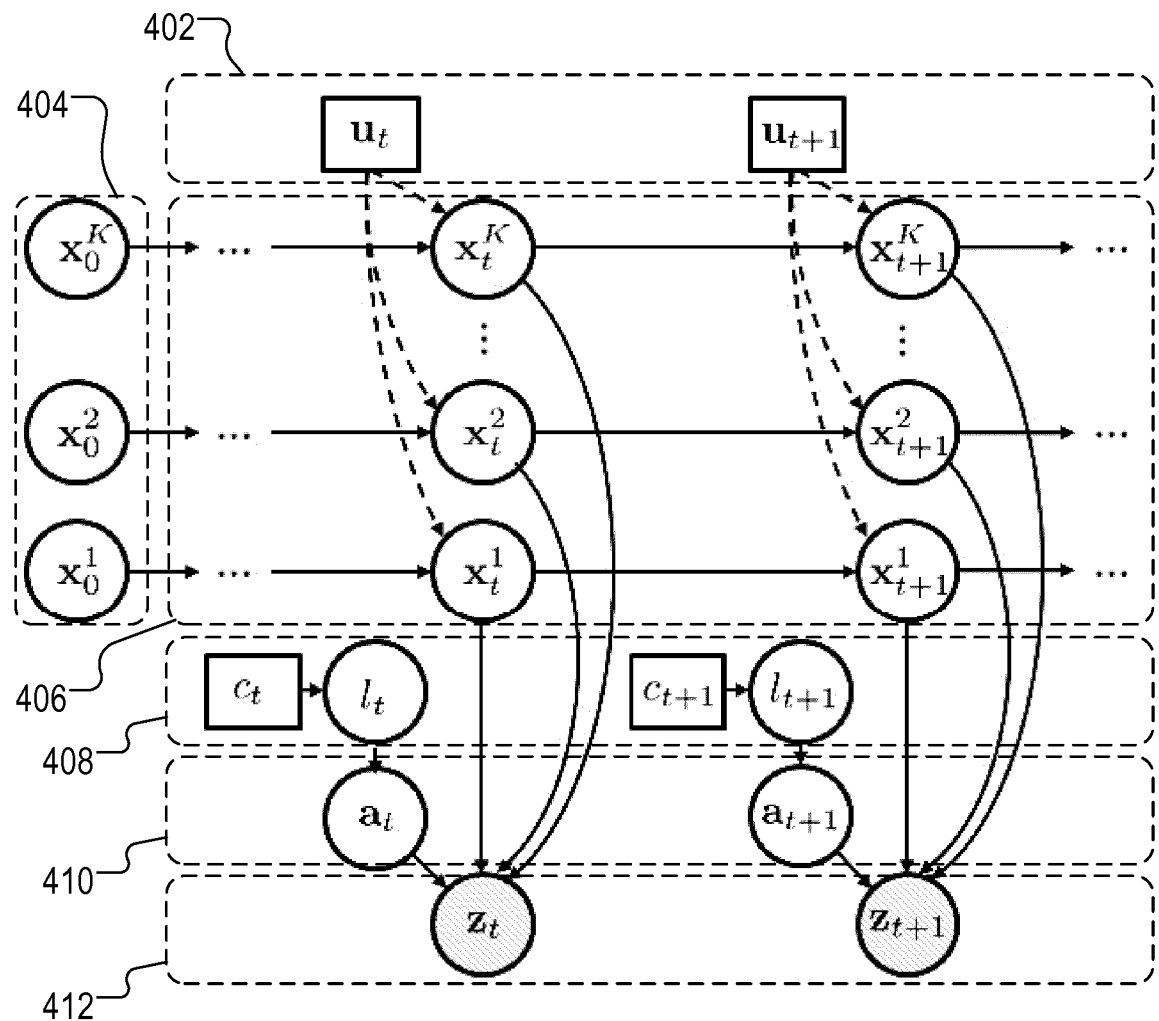
FIG. 4 illustrates the dynamic model of the active fingerprint library.

FIG. 4 illustrates the dynamic model of the active fingerprint library. $x_t^j$ is the state of the active fingerprint at the time of observation t-th wafer measurement $z_t$ 412. $u_t$ is the control action 402 and $c_t$ is the context information used in context sensitive clustering 408. $a_t$ is the decomposition coefficient 410.

Based on the model in FIG. 4 the function of the blocks in FIG. 3 can be defined as follows:

Fetch & warp 312: generate initial active fingerprints $x_0^1$ to $x_0^K$ 404.

Predict 322: estimate dynamic AFPs 406 $x_{+1}^j$ from $x_t^j$ and $u_t$.

Estimator 328: estimate $z_t$ from $c_t$, $x_t^1$ to $x_t^K$

Update 320:
estimate $x_{+1}^j$ from $x_t^j$, $u_t$ and $z_t$
add $x_{t+1}^{K+1}$ if necessary.

Advantages of embodiments of the present invention include:

A) In-line estimation of contributing factors (fingerprints) in wafer measurements, enabling early yield impact assessment when initial layers from a new product or node are being exposed in ramp-up phase. Enabling faster root cause analysis and process optimization, and potentially faster ramp and time-to-market.

B) Adaptive dynamic model (robust to e.g. process or tool usage changes in the fab).

C) Enables 'soft-assignment'-based wafer level control.

D) Facilitates root-cause and on-product performance impact analysis.

E) In-line process monitoring and easy visualization of fingerprint and context contributions to a wafer.

Figure 5:
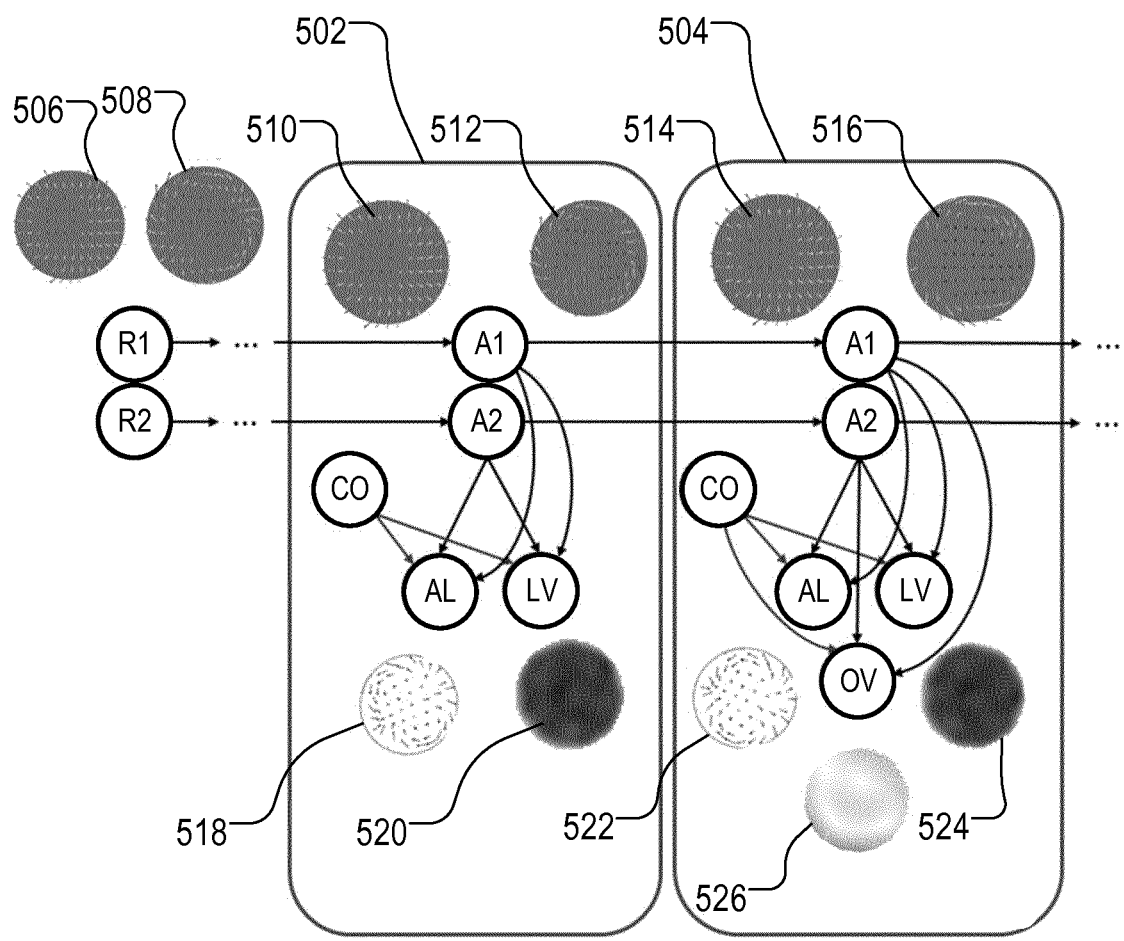
FIG. 5 illustrates a simplified example of the dynamic model of FIG. 4.

FIG. 5 illustrates a simplified example of the dynamic model of FIG. 4.

With reference to FIG. 5, two fingerprints 506 and 508 are in the reference fingerprint library (referred to as 'scaling' and 'dual swirl' fingerprints respectively). They are also shown as reference fingerprints R1 and R2. Their evolution in the active library at two time instances 502 and 504 are shown. The patterns 510 and 512 are shown at time 502 and the corresponding active fingerprints are also represented as A1 and A2. The patterns 514 and 516 are shown at time 504 and the corresponding active fingerprints are again represented as A1 and A2.

Measurements are leveling LV, alignment AL and overlay OV. Note that some measurements are not always available (e.g. OV) but when they are provided they may be utilized. Fingerprints in the library represent a common cause for the patterns seen in the wafer measurements and they manifest themselves in different type of measurements. The contribution of fingerprints A1 and A2 in the measurements AL, LV and OV depends on the context of processing CO and metrology. At time 502, the measurement result 518 of alignment measurement AL and the measurement result 520 of leveling measurement LV are shown. At time 504, the measurement result 522 of alignment measurement AL, the measurement result 524 of leveling measurement LV, and the measurement result 526 of overlay measurement OV are shown.

Horizontal arrows show evolution of fingerprints A1 and A2. Evolution herein may be temporal (for example when measurements are on single layer of different chronologically ordered wafers) or thru-stack (for example when measurement are on multiple chronologically ordered layers of one wafer). In the example of FIG. 5, it is apparent that the dual swirl fingerprint 508 slightly rotates between two time instances 502 and 504, as seen by comparing 512 and 516.

The context information "CO" may be used to attribute a relevance parameter to one or more of the active fingerprints A1, A2. The relevance parameter determines to which extend the active fingerprint(s) A1, A2 associated with said context information CO are informative as to predicting characteristics (for example a fingerprint) of measurement data (AL, LV) and/or performance data (for example overlay data OV). A low relevance parameter indicates that a certain fingerprint out of the active fingerprint library should not be taken into account for predictive purposes (for example deriving a performance parameter for process monitoring purposes) and/or control of the process.

In an embodiment a step of attributing a relevance parameter to a fingerprint out of the second updated set of fingerprints is based on the received context data.

In an embodiment performance data and/or a process control action is determined based on the relevance parameter and the fingerprint associated with the relevance parameter.

In generic terms the relevance parameter is a coordinate on the representation manifold, which in a linear case reduces to a traditional coefficient of a component based on a linear method of factorization.

Further embodiments of the invention are disclosed in the list of numbered clauses below:

1. A method of maintaining a set of fingerprints representing variation of one or more process parameters associated with one or more product units, the method comprising the steps:
    (a) receiving measurement data of one or more parameters measured on one or more product units;
    (b) determining a first updated set of fingerprints based on an expected evolution of the set of fingerprints; and
    (c) determining a second updated set of fingerprints based on decomposition of the received measurement data in terms of the first updated set of fingerprints.
2. The method of clause 1, wherein the expected evolution is one or more of: a random variation, drift due to heating, drift due to dynamics, oscillation due to dynamics, drift due to wear, (near) stable behavior.
3. The method of clause 1 or 2, wherein the measurement data comprises one or more of: leveling data, alignment data, overlay data, CD data, focus data, side-wall angle data, wafer topography data.
4. The method of any preceding clause, wherein each fingerprint has a stored likelihood of occurrence, and the decomposition of the received measurement data in terms of the first updated set of fingerprints comprises the steps:
    estimating, based on the received measurement data, likelihoods of occurrence of the first
    updated set of fingerprints in the received measurement data; and
    updating the stored likelihoods of occurrence based on the estimated likelihoods.
5. The method of clause 4, wherein the decomposition comprises using a factorial model wherein the estimated likelihoods of occurrence comprise coefficients of the factorial model.
6. The method of any preceding clause, further comprising a step of determining performance data and/or a process control action based on the decomposition of the received measurement data.
7. The method of clause 6, wherein the performance data comprises a fingerprint of a performance parameter across a product unit.
8. The method of any preceding clause, further comprising the step of receiving context data representing records of one or more process parameters of the one or more product unit(s) on which the measurement data was measured, and wherein the step (b) determining a first updated set of fingerprints is further based on the received context data.
9. The method of clause 8, further comprising a step of attributing a relevance parameter to a fingerprint out of said second updated set of fingerprints based on the received context data.
10. The method of clause 9, further comprising determining performance data and/or a process control action based on the relevance parameter and the fingerprint.
11. The method of clause 10, further comprising a step of updating the set of fingerprints based on the determined performance data and/or process control action.
12. The method of any preceding clause, wherein the step (b) of determining a first updated set of fingerprints comprises one or more of: adapting a fingerprint, adding a new fingerprint to the set, removing a fingerprint from the set.
13. The method of any preceding clause, further comprising the step of adding a fingerprint to the set by retrieving a fingerprint from a set of reference fingerprints.
14. The method of clause 13, further comprising warping the retrieved fingerprint to determine the added fingerprint.
15. The method of clause 13 or 14, wherein the set of reference fingerprints are derived from historical measurement data representing one or more parameters measured on one or more product unit.
16. The method of clause 13, 14 or 15, further comprising the step of updating the set of reference fingerprints with an updated fingerprint from the set of fingerprints.
17. The method of any preceding clause, wherein the product units are substrates.
18. A computer program comprising computer readable instructions which, when run on suitable computer apparatus, cause the computer apparatus to perform the method of any of clauses 1 to 17.
19. An apparatus specifically adapted to carry out the steps of the method as claimed any of clauses 1 to 17.
20. The method of clause 8, wherein the step (b) of determining the first updated set of fingerprints comprises the steps:
    calculating expected measurement data based on:
        predicted fingerprints; and
        the received context data;
    determining a process control action based on the calculated expected measurement data; and
    updating the set of fingerprints based on the determined process control action.
21. The method of any preceding clause, wherein the step (b) of determining a first updated set of fingerprints comprises adapting a fingerprint.
22. The method of any preceding clause, wherein the step (b) of determining a first updated set of fingerprints comprises adding a new fingerprint to the set.
23. The method of any preceding clause, wherein the step (b) of determining a first updated set of fingerprints comprises removing a fingerprint from the set.

An embodiment of the invention may be implemented using a computer program containing one or more sequences of machine-readable instructions describing methods of maintaining a set of fingerprints, as described above. This computer program may be executed within a computing apparatus, such as control unit LACU of FIG. 1, or some other controller. There may also be provided a data storage medium (e.g., semiconductor memory, magnetic or optical disk) having such a computer program stored therein.

Figure 6:
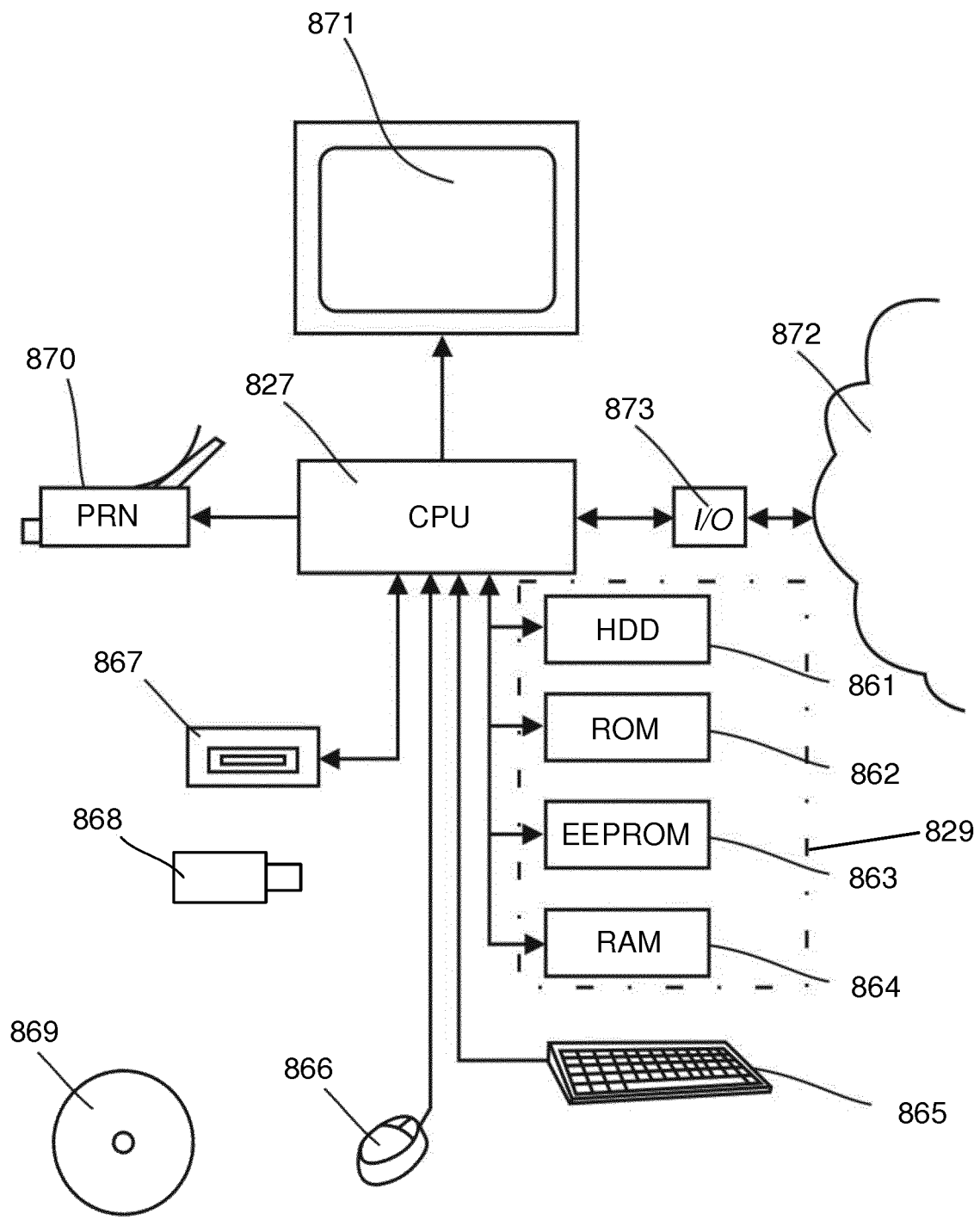
FIG. 6 illustrates computing apparatus hardware useful in implementing the methods disclosed herein.

This control unit LACU may include a computer assembly as shown in FIG. 6. The computer assembly may be a dedicated computer in the form of a control unit in embodiments of the assembly according to the invention or, alternatively, be a central computer controlling the lithographic apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 829 connected to processor 827 may comprise a number of memory components like a hard disk 861, Read Only Memory (ROM) 862, Electrically Erasable Programmable Read Only Memory (EEPROM) 863 and Random Access Memory (RAM) 864. Not all aforementioned memory components need to be present. Furthermore, it is not essential that aforementioned memory components are physically in close proximity to the processor 827 or to each other. They may be located at a distance away.

The processor 827 may also be connected to some kind of user interface, for instance a keyboard 865 or a mouse 866. A touch screen, track ball, speech converter or other interfaces that are known to persons skilled in the art may also be used.

The processor 827 may be connected to a reading unit 867, which is arranged to read data, e.g. in the form of computer executable code, from and under some circumstances store data on a data carrier, like a solid-state drive 868 or a CDROM 869. Also DVD's or other data carriers known to persons skilled in the art may be used.

The processor 827 may also be connected to a printer 870 to print out output data on paper as well as to a display 871, for instance a monitor or LCD (Liquid Crystal Display), of any other type of display known to a person skilled in the art.

The processor 827 may be connected to a communications network 872, for instance a public switched telephone network (PSTN), a local area network (LAN), a wide area network (WAN) etc. by means of transmitters/receivers 873 responsible for input/output (I/O). The processor 827 may be arranged to communicate with other communication systems via the communications network 872. In an embodiment of the invention external computers (not shown), for instance personal computers of operators, can log into the processor 827 via the communications network 872.

The processor 827 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 827 may even be located a distance away of the other processing units and communicate via communications network 872. Connections between modules can be made wired or wireless.

The computer system can be any signal processing system with analogue and/or digital and/or software technology arranged to perform the functions discussed here.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of maintaining a set of fingerprints representing variation of one or more process parameters associated with one or more product units processed by a manufacturing process, the method comprising:
   receiving measurement data of one or more parameters measured on one or more product units;
   determining a first updated set of fingerprints based on an expected evolution of the set of fingerprints; and
   determining a second updated set of fingerprints based on decomposition of the received measurement data in terms of the first updated set of fingerprints.

2. The method of claim 1, wherein the expected evolution is one or more selected from a random variation, drift due to heating, drift due to dynamics, oscillation due to dynamics, drift due to wear, and/or (near) stable behavior.

3. The method of claim 1, wherein the measurement data comprises one or more selected from leveling data, alignment data, overlay data, CD data, focus data, side-wall angle data, and/or wafer topography data.

4. The method of claim 1, wherein each fingerprint has a stored likelihood of occurrence, and the decomposition of the received measurement data in terms of the first updated set of fingerprints comprises:
   estimating, based on the received measurement data, likelihoods of occurrence of the first updated set of fingerprints in the received measurement data; and
   updating the stored likelihoods of occurrence based on the estimated likelihoods.

5. The method of claim 4, wherein the decomposition comprises using a factorial model wherein the estimated likelihoods of occurrence comprise coefficients of the factorial model.

6. The method of claim 1, further comprising determining performance data and/or a process control action, based on the decomposition of the received measurement data.

7. The method of claim 6, comprising determining performance data, wherein the performance data comprises a fingerprint of a performance parameter across a product unit.

8. The method of claim 1, further comprising the stop of receiving context data representing one or more records of one or more process parameters of the one or more product unit(s) on which the measurement data was measured, and wherein the determining a first updated set of fingerprints is further based on the received context data.

9. The method of claim 8, further comprising a step of attributing a relevance parameter to a fingerprint out of the second updated set of fingerprints based on the received context data.

10. The method of claim 9, further comprising determining performance data and/or a process control action, based on the relevance parameter and the fingerprint.

11. The method of claim 10, further comprising a-step-of updating the set of fingerprints based on the determined performance data and/or process control action.

12. The method of claim 1, wherein the determining a first updated set of fingerprints comprises one or more selected from of: adapting a fingerprint of the set, adding a new fingerprint to the set, and/or removing a fingerprint from the set.

13. The method of claim 1, further comprising adding a fingerprint to the set by retrieving a fingerprint from a set of reference fingerprints.

14. The method of claim 13, further comprising warping the retrieved fingerprint to determine the added fingerprint.

15. The method of claim 13, wherein the set of reference fingerprints are derived from historical measurement data representing one or more parameters measured on one or more product units.

16. The method of claim 13, further comprising updating the set of reference fingerprints with an updated fingerprint from the set of fingerprints.

17. The method of claim 1, wherein the one or more product units are one or more substrates processed by a device manufacturing method.

18. The method of claim 8, wherein the determining the first updated set of fingerprints comprises:
calculating expected measurement data based on:
one or more predicted fingerprints; and
the received context data;
determining a process control action based on the calculated expected measurement data; and
updating the set of fingerprints based on the determined process control action.

19. A non-transitory computer-readable medium comprising instructions stored therein, the instructions, upon execution by a computer system, configured to cause the computer system to at least:
receive measurement data of one or more parameters measured on one or more product units processed by a manufacturing process, wherein a set of fingerprints represent variation of one or more process parameters associated with one or more product units;
determine a first updated set of fingerprints based on an expected evolution of the set of fingerprints; and
determine a second updated set of fingerprints based on decomposition of the received measurement data in terms of the first updated set of fingerprints.

20. An apparatus specifically configured to carry out the method of claim 1.

* * * * *